(12) United States Patent
Platow et al.

(10) Patent No.: US 11,798,775 B2
(45) Date of Patent: Oct. 24, 2023

(54) EXTENDED LIFETIME DUAL INDIRECTLY-HEATED CATHODE ION SOURCE

(71) Applicant: Axcelis Technologies, Inc., Beverly, MA (US)

(72) Inventors: Wilhelm Platow, Newburyport, MA (US); Neil Bassom, Hamilton, MA (US); Jonathan David, Newton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 79 days.

(21) Appl. No.: 17/491,084

(22) Filed: Sep. 30, 2021

(65) Prior Publication Data

US 2023/0100805 A1 Mar. 30, 2023

(51) Int. Cl.
*H01J 27/00* (2006.01)
*H01J 37/08* (2006.01)
(Continued)

(52) U.S. Cl.
CPC ............ *H01J 37/08* (2013.01); *H01J 37/075* (2013.01); *H01J 37/3171* (2013.01)

(58) Field of Classification Search
CPC ........ H01J 37/08; H01J 37/3171; H01J 37/04; H01J 2237/082; H01J 2237/06308; H01J 2237/03; H01J 27/08
See application file for complete search history.

(56) References Cited

U.S. PATENT DOCUMENTS 5,497,006 A 3/1996 Sferlazzo et al.
6,356,026 B1 * 3/2002 Murto .................... H01J 37/08
315/111.21
(Continued)

FOREIGN PATENT DOCUMENTS

JP 2005251468 A 9/2005
JP 2009217985 A * 9/2009 .............. H01J 27/14
(Continued)

OTHER PUBLICATIONS

International Search Report dated Sep. 27, 2022 in connection with PCT/US2022/035516.

*Primary Examiner* — David E Smith
*Assistant Examiner* — Hsien C Tsai
(74) *Attorney, Agent, or Firm* — Eschweiler & Potashnik, LLC

(57) ABSTRACT

An ion source has an arc chamber with a first end and a second end. A first cathode at the first end of the arc chamber has a first cathode body and a first filament disposed within the first cathode body. A second cathode at the second end of the arc chamber has a second cathode body and a second filament disposed within the second cathode body. A filament switch selectively electrically couples a filament power supply to each of the first filament and the second filament, respectively, based on a position of the filament switch. A controller controls the position of the filament switch to alternate the electrical coupling of the filament power supply between the first filament and the second filament for a plurality of switching cycles based on predetermined criteria. The predetermined criteria can be a duration of operation of the first filament and second filament.

20 Claims, 6 Drawing Sheets

(51) Int. Cl.
*H01J 37/075* (2006.01)
*H01J 37/317* (2006.01)

(56) References Cited

U.S. PATENT DOCUMENTS

| | | | |
|---|---|---|---|
| 7,791,041 B2 | 9/2010 | Yamashita | |
| 8,658,986 B1 * | 2/2014 | Jerez | H01J 27/00 250/426 |
| 2009/0243490 A1 * | 10/2009 | Cho | H01J 37/3171 315/111.81 |

FOREIGN PATENT DOCUMENTS

| | | | | |
|---|---|---|---|---|
| JP | 2009217985 A | 9/2009 | | |
| WO | WO-2005045877 A1 * | 5/2005 | ............. | H01J 1/135 |

* cited by examiner

EXTENDED LIFETIME DUAL INDIRECTLY-HEATED CATHODE ION SOURCE

TECHNICAL FIELD

The present invention relates generally to ion implantation systems, and more specifically to an ion source having multiple indirectly-heated cathodes selectively electrically coupled to a filament power supply to increase a lifetime of the ion source.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energizes and directs the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining or improving desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Ion sources (commonly referred to as arc discharge ion sources) generate ion beams used in implanters and can include heated filament cathodes for creating ions that are shaped into an appropriate ion beam for wafer treatment. U.S. Pat. No. 5,497,006 to Sferlazzo et al., for example, discloses an ion source having a cathode supported by a base and positioned with respect to a gas confinement chamber for ejecting ionizing electrons into the gas confinement chamber. The cathode of the Sferlazzo et al. is a tubular conductive body having an endcap that partially extends into the gas confinement chamber. A filament is supported within the tubular body and emits electrons that heat the endcap through electron bombardment, thereby thermionically emitting ionizing electrons into the gas confinement chamber.

Conventionally, the filament is located at one side of the chamber. In many popular ion sources, an indirectly heated cathode (IHC) is implemented, wherein a tungsten cap is positioned over the filament, and whereby the filament heats the cap, while the cap protects the filament in order to increase a lifetime of the ion source. The cap or cathode, however is sputtered away over time. As such, the thickness of cap is made large, whereby the filament is heated to high temperatures to emit a substantial amount of electrons. The cap in this instance thus acts like a filament to emit electrons, but because of its significant thickness, a longer life has been attainable.

The lifetime of ion sources is a significant concern for ion implanters, where failure of the ion source can lead to unwanted scheduled maintenance and downtime. Failure of the cathode, for example, is typically the dominant factor for ion source life, particularly when forming multi-charged arsenic ion beams.

SUMMARY

The present disclosure thus provides various systems and methods for increasing the efficiency and lifetime of an ion source. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, an ion source is provided for an ion implantation system, wherein the ion source comprises an arc chamber having a first end and a second end. A first cathode associated with the first end of the arc chamber, for example, comprises a first cathode body and a first filament disposed within the first cathode body. The first cathode, for example, defines a first indirectly heated cathode. A second cathode associated with the second end of the arc chamber, for example, comprises a second cathode body and a second filament disposed within the second cathode body. The second cathode, for example, defines a second indirectly heated cathode.

According to one example, a filament power supply is provided, and a filament switch is configured to selectively electrically couple the filament power supply to each of the first filament and the second filament, respectively, based on a position of the filament switch. A controller, for example, is further provided and configured to control the position of the filament switch to alternate the selective electrical coupling of the filament power supply between the first filament and second filament for a plurality of switching cycles based on one or more predetermined criteria.

The one or more predetermined criteria, for example, can comprise a respective first predetermined duration of electrical coupling of the filament power supply to the first filament and a second predetermined duration of electrical coupling of the filament power supply to the second filament. The one or more predetermined criteria, for example, can further comprise a first total time at which the filament power supply is electrically coupled to the first filament over the plurality of switching cycles and a second total time at which the filament power supply is electrically coupled to the second filament over the plurality of switching cycles. In one example, the first predetermined duration of electrical coupling of the first filament and the second predetermined duration of electrical coupling of the second filament can differ from one another for at least one of the plurality of switching cycles. In another example, the first total time and the second total time are approximately equal. In yet another example, the one or more predetermined criteria can comprise a predetermined thickness of one or more respective walls of the first cathode body and the second cathode body.

According to another example aspect, the first cathode body and the second cathode body are identical. In another example aspect, the first cathode body comprises a first end wall facing the second end of the arc chamber, and the second cathode body comprises a second end wall facing the first end of the arc chamber. The first end wall has a first wall thickness, and the second end wall has a second wall thickness, and wherein the second wall thickness is greater than the first wall thickness.

In accordance with another example, the filament switch comprises a relay, wherein the controller is configured to alternate the electrical coupling of the filament power supply between the first filament and the second filament via a control of the relay.

In yet another example, the ion source further comprises a cathode power supply and a cathode switch configured to selectively electrically couple the cathode power supply to each of the first cathode and the second cathode, respectively, based, at least in part, on a position of the cathode switch. The controller, for example, can be further configured to control the position of the cathode switch based, at least in part, on the position of the filament switch.

In accordance with another example aspect, an ion source for an ion implantation system is provided comprising an arc chamber having a first end and a second end that opposes the first end. A first cathode, for example, is positioned proximate to the first end of the arc chamber, wherein the first cathode comprises a first cathode body having a first end wall facing the second end of the arc chamber, and a first filament disposed within the first cathode body. A second cathode, for example, is positioned proximate to the second end of the arc chamber, wherein the second cathode comprises a second cathode body having a second end wall facing the first end of the arc chamber, and a second filament disposed within the second cathode body.

In the present example, a filament power supply and a filament switch is further provided, wherein the filament switch is configured to selectively electrically couple the filament power supply to each of the first filament and the second filament, respectively, based on a position of the filament switch. A controller is further configured to control the position of the filament switch to alternate the electrical coupling of the filament power supply between the first filament and second filament for a plurality of switching cycles based on one or more predetermined criteria.

The one or more predetermined criteria, for example, can comprise a first total time at which the filament power supply is electrically coupled to the first filament over the plurality of switching cycles and a second total time at which the filament power supply is electrically coupled to the second filament over the plurality of switching cycles, wherein the first total time and second total time are approximately equal.

For example, the one or more predetermined criteria can comprise a respective first predetermined duration of operation of the first filament for at least one of the plurality of switching cycles and a second predetermined duration of operation of the second filament for the at least one of the plurality of switching cycles, wherein the first predetermined duration of operation of the first filament and the second predetermined duration of operation of the second filament differ from one another. However, in one example, over the plurality of switching cycles, the first total time and second total time can be made approximately equal by controlling the first and second predetermined durations of operation for each of the plurality of switching cycles.

In another example, the one or more predetermined criteria can comprise a predetermined thinning over one or more of the first total time and second total time of one or more of the first end wall and the second end wall. In yet another example, the first end wall can be initially defined by a first wall thickness, and the second end wall can be initially defined by a second wall thickness, wherein the second wall thickness is greater than the first wall thickness.

In yet another example, a cathode power supply can be further provided, wherein a cathode switch is further configured to selectively electrically couple the cathode power supply to each of the first cathode and the second cathode, respectively, based, at least in part, on the position of the filament switch.

In accordance with another example aspect of the present disclosure, a method for increasing a lifetime of an ion source is provided. The method, for example, comprises providing a source material to an arc chamber, electrically coupling a filament power supply to a first filament of a first indirectly heated cathode disposed within the arc chamber, and energizing the first filament via the filament power supply, thereby heating the first indirectly heated cathode to aid in forming a plasma from the source material within the arc chamber. The filament power supply, for example, can then be electrically decoupled from the first filament, and the filament power supply is electrically coupled to a second filament of a second indirectly heated cathode disposed within the arc chamber. The second filament can thus be energized via the filament power supply, thereby heating the second indirectly heated cathode to aid in forming the plasma within the arc chamber. The filament power supply is subsequently electrically decoupled from the second filament. The coupling and decoupling of the filament power supply to the respective first and second filaments and energizing of the respective first and second filaments, for example, can be repeated for any number of iterations until one or more predetermined criteria are met.

The one or more predetermined criteria, for example, can comprise one or more of a first total time at which the filament power supply is electrically coupled to the first filament and a second total time at which the filament power supply is electrically coupled to the second filament. For example, the first total time and the second total time are approximately equal. In another example, the first filament is energized via the filament power supply for a first predetermined duration, and the second filament is energized via the filament power supply for a second predetermined duration, wherein the first predetermined duration and second predetermined duration are selectively variable based on the iteration of repetition.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
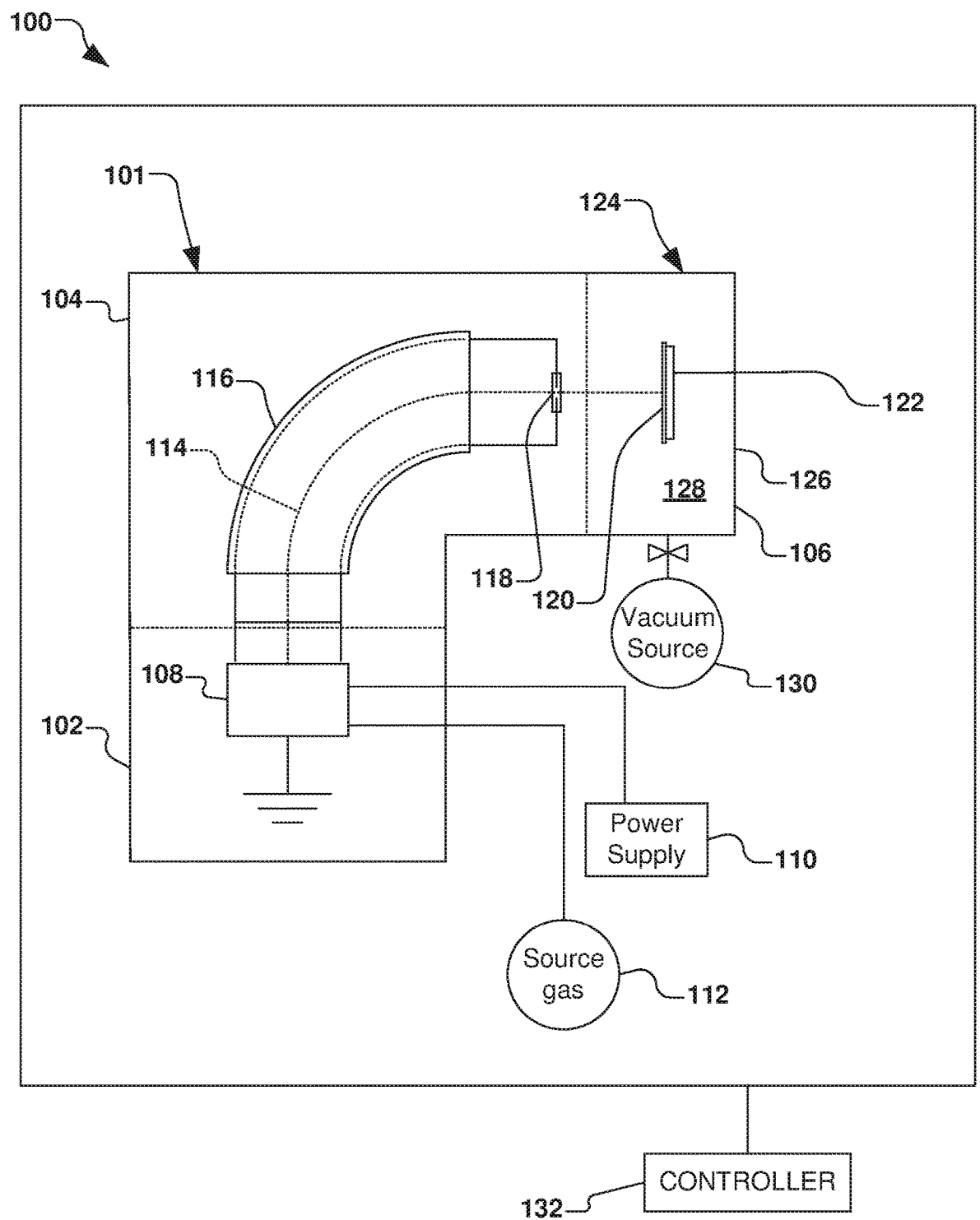
FIG. 1 is a block diagram of an exemplary vacuum system utilizing an ion source in accordance with several aspects of the present disclosure.

The present disclosure is directed generally toward an ion implantation system and an ion source associated therewith. More particularly, the present disclosure is directed toward a system and apparatus for increasing an ion beam current and lifetime of the ion source. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or components in one embodiment, and may also or alternatively be fully or partially implemented in a common feature or component in another embodiment.

Referring now to the Figures, in order to gain a better appreciation of various aspects of the disclosure, FIG. 1 illustrates an exemplified vacuum system 100 that may implement various apparatus, systems, and methods of the present disclosure. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110, whereby a source gas 112 (also called a dopant gas) supplied thereto is ionized into a plurality of ions to form an ion beam 114. The ion beam 114 in the present example is directed through a beam-steering apparatus 116, and out an aperture 118 towards the end station 106. In the end station 106, the ion beam 114 bombards a workpiece 120 (e.g., a semiconductor such as a silicon wafer, a display panel, etc.), which is selectively clamped or mounted to a chuck 122 (e.g., an electrostatic chuck or ESC). Once embedded into the lattice of the workpiece 120, the implanted ions change the physical and/or chemical properties of the workpiece. Because of this, ion implantation is used in semiconductor device fabrication and in metal finishing, as well as various applications in materials science research.

The ion beam 114 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 124, such as a vacuum chamber 126, wherein a process environment 128 is associated with the process chamber. The process environment 128 within the process chamber 124, for example, comprises a vacuum produced by a vacuum source 130 (e.g., a vacuum pump) coupled to the process chamber and configured to substantially evacuate the process chamber. Further, a controller 132 is provided for overall control of the vacuum system 100.

The present disclosure provides an apparatus configured to increase beam current and utilization of the ion source 108 while decreasing downtime of the ion source in the ion implantation system 101 discussed above. It shall be understood that the apparatus of the present disclosure may be implemented in various semiconductor processing equipment such as CVD, PVD, MOCVD, etching equipment, and various other semiconductor processing equipment, and all such implementations are contemplated as falling within the scope of the present disclosure. The apparatus of the present disclosure further advantageously increases the length of usage of the ion source 108 between preventive maintenance cycles, and thus increases overall productivity and lifetime of the system vacuum 100.

The ion source 108, for example, plays a large role in the ion implantation system 101. As such, the performance of the ion source 108 can play a large role in metrics associated with the ion implantation system 101, such as throughput, uptime, glitch rate, as well as desired implantation parameters such as energy states of the desired ion species.

For example, when implanting arsenic (As) ions into the workpiece 120, multiply-charged arsenic ions are extracted from the ion source 108 to form the ion beam 114. Arsenic, however, typically yields a high sputter rate within the ion source due to its high atomic mass. A high arc voltage and arc current is also provided by the power supply 110 for multi-charge operation, thus further increasing the sputter rate seen on components such as cathodes (not shown in FIG. 1) within the ion source 108. In conventional systems, such sputtering can lead to a decreased lifetime of the cathode of the ion source. To a degree, increasing a thickness of the cathode can increase its lifetime; however, the degree to which the thickness of the cathode can be increased in order to prolong its lifetime is limited due to difficulties associated with a control of heating and operation of such thickened cathodes.

The present disclosure provides a novel approach for increasing the lifetime of the ion source 108 by providing a plurality of cathodes within the ion source, wherein power is selectively applied to the plurality of cathodes in an alternating manner. As illustrated in a first example shown in FIG. 2, an ion source chamber 200 is shown, wherein an arc chamber 202 defines an enclosed region 204 for forming ions, wherein the ion beam 114 of FIG. 1 is extracted through an extraction aperture 206 defined in the arc chamber. The arc chamber 202 of FIG. 2, for example, has a first end 208 and a second end 210, wherein a first cathode 212 is positioned proximate to the first end of the arc chamber. The first cathode 212, for example, comprises a first cathode body 214, whereby a first filament 216 is disposed within the first cathode body. In the present example, the first cathode body 214 is generally hollow and comprises a first body wall 220 (e.g., a first end wall 221 facing the second end 210 of the arc chamber 202) having a first body wall thickness 222, wherein the first filament 216 is generally surrounded by the first body wall. In the arrangement shown in FIG. 2, the first cathode 212 thus generally defines a first indirectly heated cathode 224.

A second cathode 226, for example, is further positioned proximate to the second end 210 of the arc chamber 202, wherein the second cathode comprises a second cathode body 228 having a second filament disposed 230 within the second cathode body. The second cathode body 228, for example, is generally hollow and comprises a second body wall 232 (e.g., a second end wall 233 facing the first end 208 of the arc chamber 202) having a second body wall thickness 234, wherein the second filament 230 is generally surrounded by the second body wall. In the arrangement shown in FIG. 2, the second cathode 226 thus generally defines a second indirectly heated cathode 236.

Figure 2:
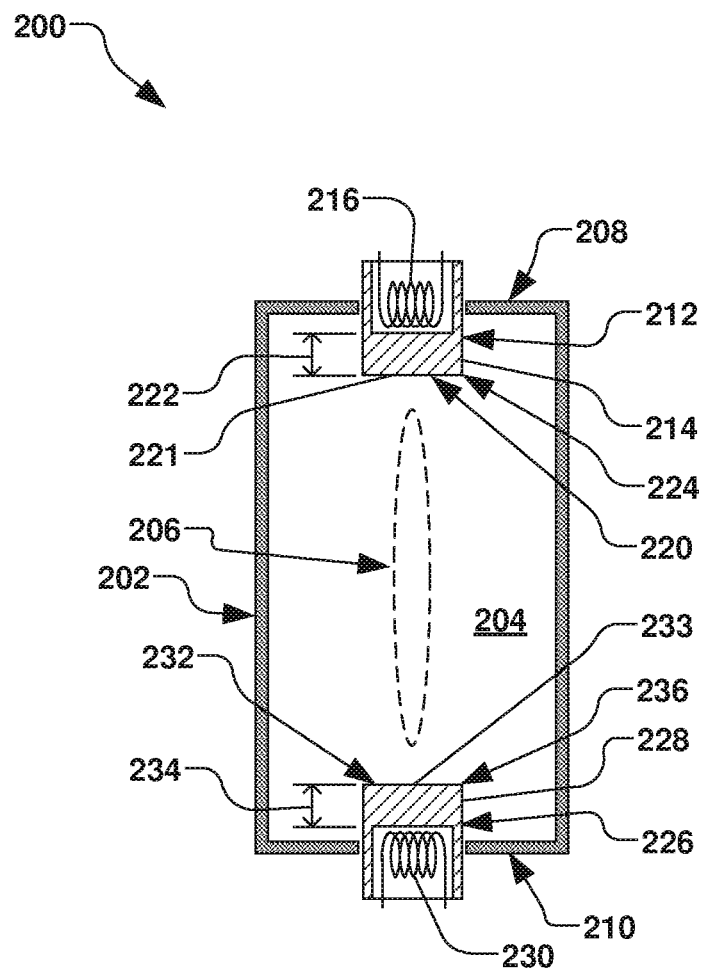
FIG. 2 is a block diagram of a side view of an example arc chamber in accordance with several aspects of the present disclosure.

In the present example shown in FIG. 2, the first cathode 212 and second cathode 226 are substantially identical, and the first body wall thickness 222 is approximately equal to the second body wall thickness 234. It should be noted, however, that the configuration, size, and shape of the first cathode 212 can differ from that of the second cathode 226. For example, the first body wall thickness 222 can be less than the second body wall thickness 234 (e.g., such as illustrated in FIG. 3), or vice-versa, as will be discussed further infra.

Figure 3:
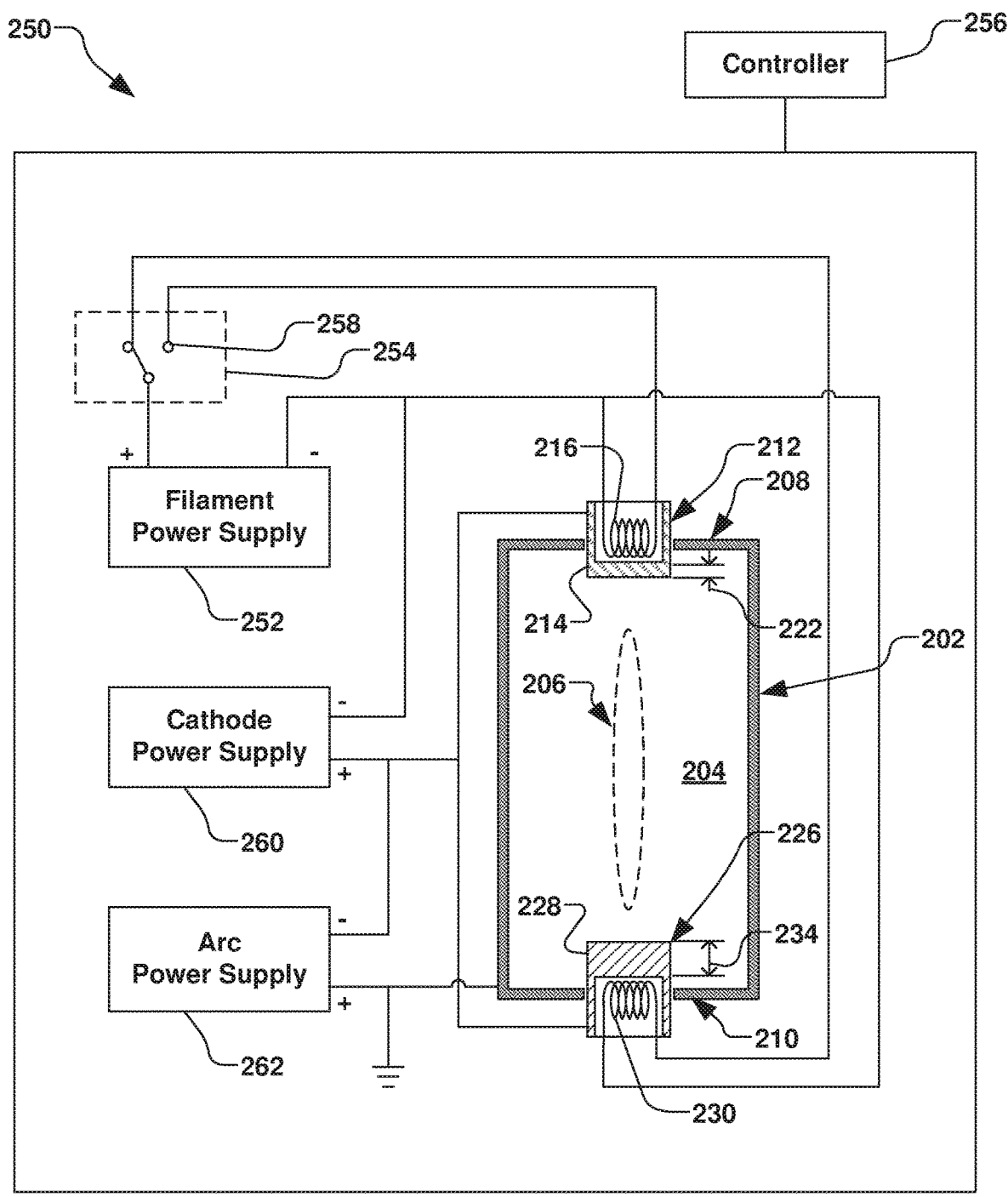
FIG. 3 is a schematic block diagram of an example ion source in accordance with several aspects of the present disclosure.

As illustrated in the example ion source 250 shown in FIG. 3, the present disclosure further provides a filament power supply 252, wherein a filament switch 254 is configured to selectively electrically couple the filament power supply to each of the first filament 216 and the second filament 230 based on a position of the filament switch. As shown in FIG. 3, the filament switch 254 is positioned to provide power from the filament power supply 252 to the second filament 230 of the second cathode 226. While the filament switch 254 may be manually controlled, the present disclosure further provides a controller 256 configured to control the position of the filament switch to alternate the selective electrical coupling of the filament power supply 252 between the first filament 216 and the second filament 230. The filament switch 254, for example, comprises a relay 258, wherein the controller is configured to alternate the electrical coupling of the filament power supply 252 between the first filament 216 and the second filament 230 via a control of the relay.

The controller 256, for example, can be a stand-alone controller for localized control of the ion source 250. In one example, the controller 256 may be incorporated into the controller 132 shown in FIG. 1 providing overall control of various other components of the vacuum system 100. All such controllers, including associated software and logic, as well as manual control by an operator, are considered as falling within the scope of the present disclosure.

In accordance with the present example, the controller 256 of FIG. 3, for example, is configured to alternatingly electrically couple the filament power supply 252 to the respective first filament 216 and second filament 230 a plurality of times, thus defining a plurality of switching cycles. A "switching cycle", for example, comprises switching the electrical coupling of the filament power supply 252 from the first filament 216 to the second filament 230, and back to the first filament.

The alternation of electrical coupling of the filament power supply 252 between the first filament 216 and second filament 230 by the controller 256, for example, is based on one or more predetermined criteria. In one example, the one or more predetermined criteria comprise a respective first predetermined duration during which the filament power supply 252 is electrically coupled to the first filament 216 and a second predetermined duration during which the filament power supply is electrically coupled to the second filament 230, for any given switching cycle. In operation, during the first predetermined duration, for example, the first filament 216 heats the first cathode 212 to aid in forming a plasma (not shown) within the enclosed region 204 of the arc chamber 202 and subsequent extraction of ions through the extraction aperture 206. Similarly, during the second predetermined duration, the second filament 230 heats the second cathode 226 to aid in forming the plasma within the enclosed region 204 of the arc chamber 202 and subsequent extraction of ions through the extraction aperture 206.

While the first predetermined duration and the second predetermined duration can be equal, in one example, the first and second predetermined durations can differ from one another for at least one of the plurality of switching cycles. In one non-limiting example, in a first switching cycle, the first predetermined duration during which the first filament 216 is electrically coupled to the filament power supply 252 is sixty minutes, while the second predetermined duration during which the second filament 230 is electrically coupled to the filament power supply is eighty minutes. In a second switching cycle, the first predetermined duration during which the first filament 216 is electrically coupled to the filament power supply 252 is ninety minutes, while the second predetermined duration during which the second filament 230 is electrically coupled to the filament power supply is seventy minutes. It should be noted that while two switching cycles are provided herein as an example, any number of switching cycles and first and second predetermined durations are contemplated as falling within the scope of the present disclosure.

In the preceding example, it is noted that a first total time at which the filament power supply 252 is electrically coupled to the first filament 216 over the two switching cycles is equal to a second total time at which the filament power supply is electrically coupled to the second filament 230 (e.g., one-hundred and fifty minutes). The present disclosure appreciates that providing approximately equal first total time and second total time during which the first filament 216 and second filament 230 are electrically coupled to the filament power supply 252 can provide substantially even wear to both of the first cathode 212 and second cathode 226. As such, the one or more predetermined criteria upon which the alternation of electrical coupling of the filament power supply 252 between the first filament 216 and second filament 230 is based can comprise the first total time at which the filament power supply is electrically coupled to the first filament over the plurality of switching cycles and a second total time at which the filament power supply is electrically coupled to the second filament over the plurality of switching cycles. In one example, time taken for switching between the first filament 216 and second filament 230 (e.g., a time when no implantation is being performed on workpieces) can be taken into account and compensated for in successive cycles.

In accordance with another example aspect, the present disclosure further appreciates that the one or more predetermined criteria can further comprise a predetermined thickness of one or more of the first and second walls 222, 234 of the first and second cathode bodies 214, 228. The predetermined thickness, for example, can be associated with a beginning thickness prior to any formation of plasma, or a decreased thickness of the respective first and second walls 222, 234 after the plasma formation and subsequent sputtering and erosion, thereof. For example, for a given initial thickness of the one or more of the first and second walls 222, 234 of the first and second cathode bodies 214, 228, the controller 256 can be configured to control the switching of the electrical coupling between the filament power supply 252 and the first and second filaments 216, 230 for a predetermined number of switching cycles, whereby the first and second total times is approximately equivalent. Such a control can be further based on process parameters of the vacuum system 100 of FIG. 1, such as a length of time a given batch of workpieces 120 are to be processed at predetermined parameters associated with the vacuum system 100 of FIG. 1.

In the example illustrated in FIG. 3, a cathode power supply 260 is electrically coupled to both the first cathode 212 and second cathode 226, whereby the cathode power supply biases the first and second cathodes with respect to an arc power supply 262, and whereby the arc power supply biases the arc chamber 202 with respect to ground. The cathode power supply 260 shown in FIG. 3, for example, provides power to both the first cathode 212 and second cathode 226 simultaneously, whereby the only power that is switched between cathodes comes from switching between the first filament 216 and second filament 230. Thus, a cathode/anti-cathode (also called a repeller) relationship is generally determined by the switching of the filament power supply 252 between the first and second filaments 216, 230 of the first and second cathodes 212, 226.

Figure 4:
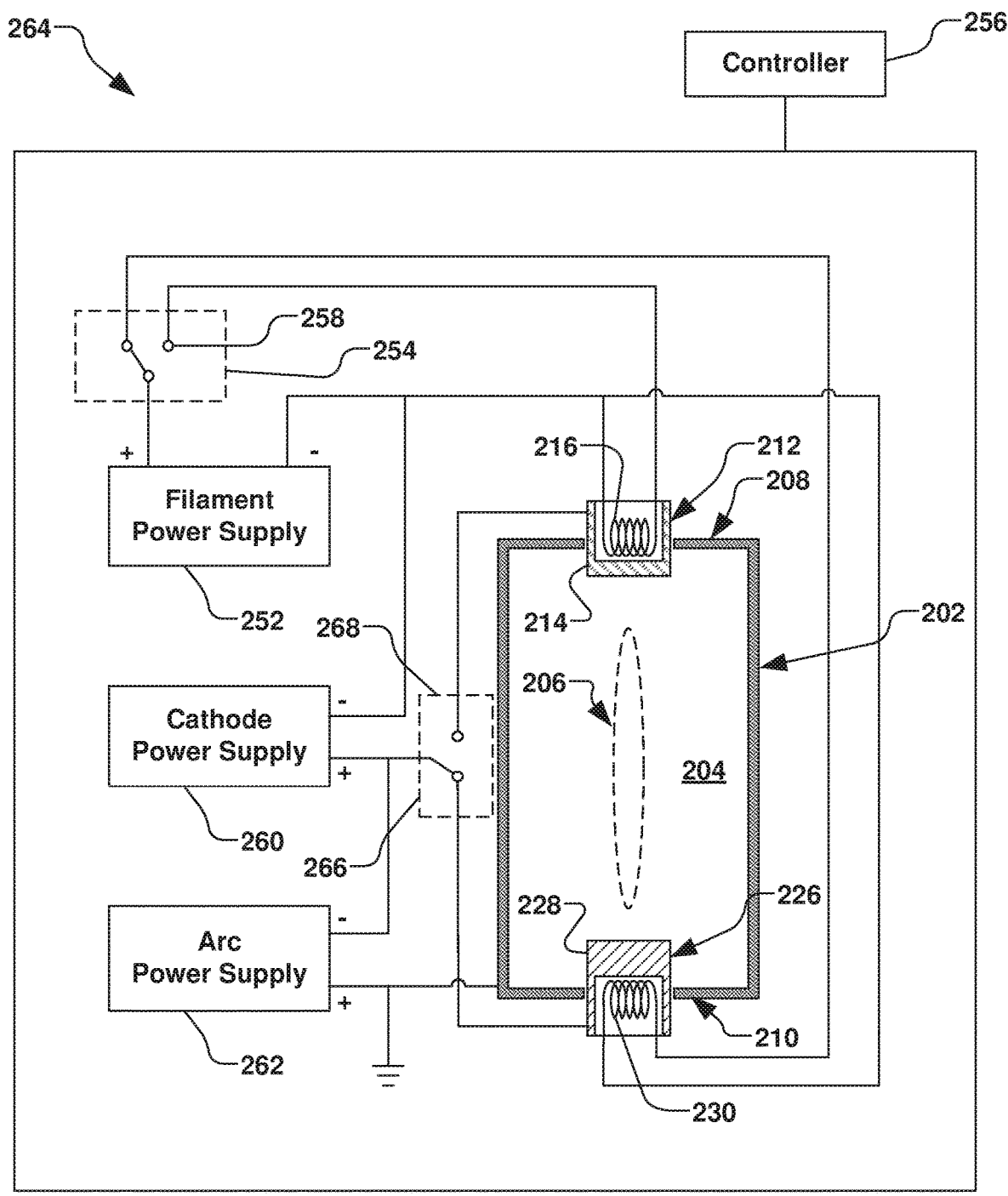
FIG. 4 is a schematic block diagram of another example ion source in accordance with several aspects of the present disclosure.

In another example ion source 264 shown in FIG. 4, a cathode switch 266 is further provided and configured to selectively electrically couple the cathode power supply 260 to each of the first cathode 212 and the second cathode 226, respectively. The selective electrical coupling of the cathode power supply 260 to each of the first cathode 212 and the second cathode 226, for example, is based on the position of the cathode switch 266, wherein the controller 256 is further configured to control the position of the cathode switch based, at least in part, on the position of the filament switch 254. In the present example, the cathode switch 266 is shown as electrically coupling the cathode power supply 260 to the second cathode 226, while allowing the first cathode 212 to float.

The present disclosure, for example, can increase a lifetime of the ion source up to four times, as compared to conventional systems. It is presently contemplated that switching of power from the filament power supply 252 to the first and second filaments 216, 230 associated with the first and second cathodes 212, 226 has a positive effect on cleaning or otherwise refreshing the respective first and second cathodes. The inventors have shown experimentally that, when powering first filament 216 of the first cathode 212 (while not powering the second filament 230), tungsten from the first cathode may be deposited on the second cathode 226, and that vice versa, when powering second filament of the second cathode (while not powering the first filament), that tungsten from the second cathode may be deposited on the first cathode. As such, by switching the power to the first and second filaments 216, 230, the tungsten is iteratively grown and sputtered from the first and second cathodes 212, 226, whereby a greater lifetime of the ion source can be achieved over conventional systems. By providing the aforementioned switching cycles, a quasi-cleaning process is believed to be achieved, whereby wear to the first and second cathodes 212, 226 is kept more uniform over conventional systems.

Figure 5:
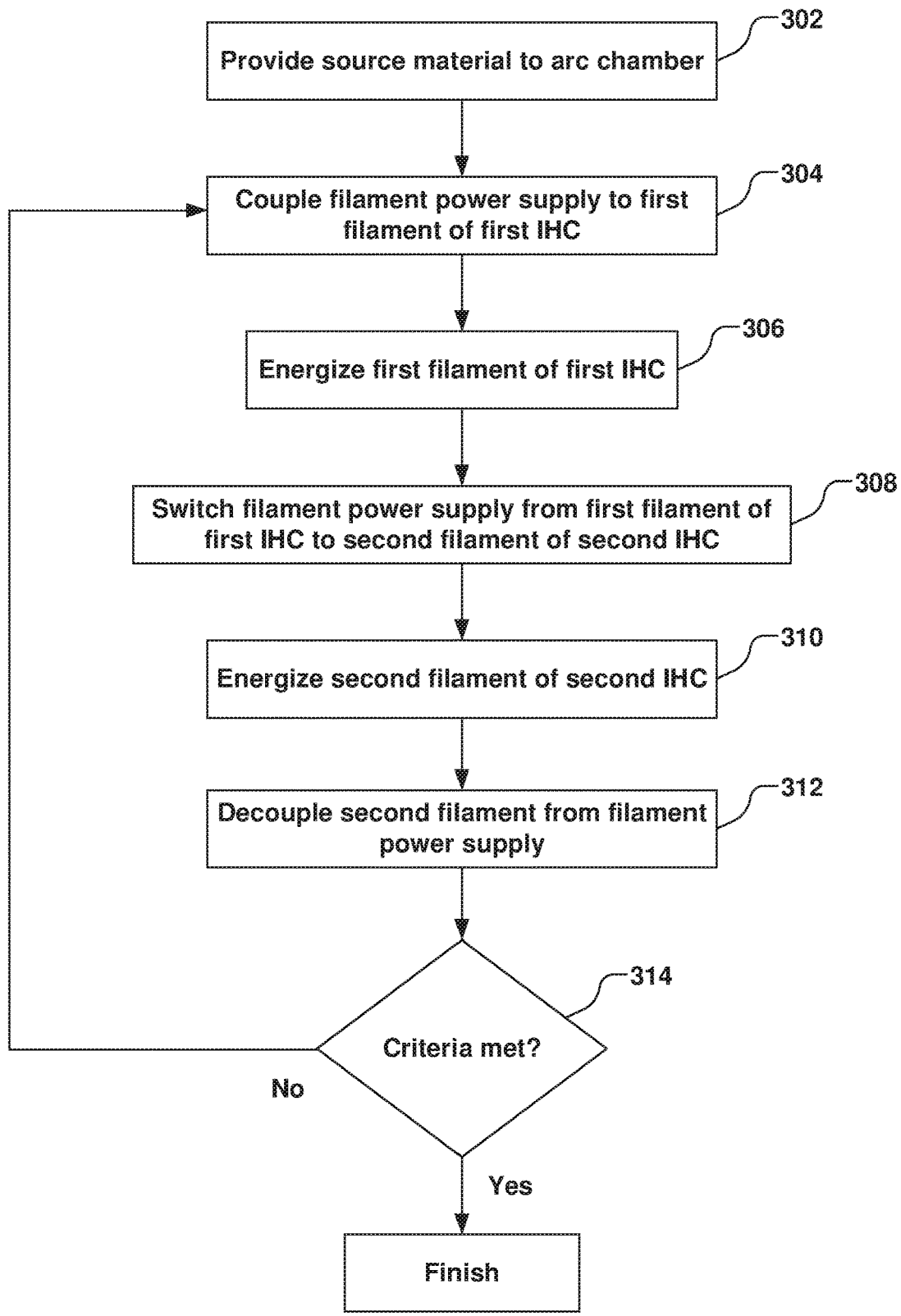
FIG. 5 illustrates a method for improving a lifetime of an ion source in accordance with various aspects of the present disclosure.

In accordance with yet another exemplary aspect, a method 300 is provided in FIG. 5 for improving a lifetime of an ion source. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 6:
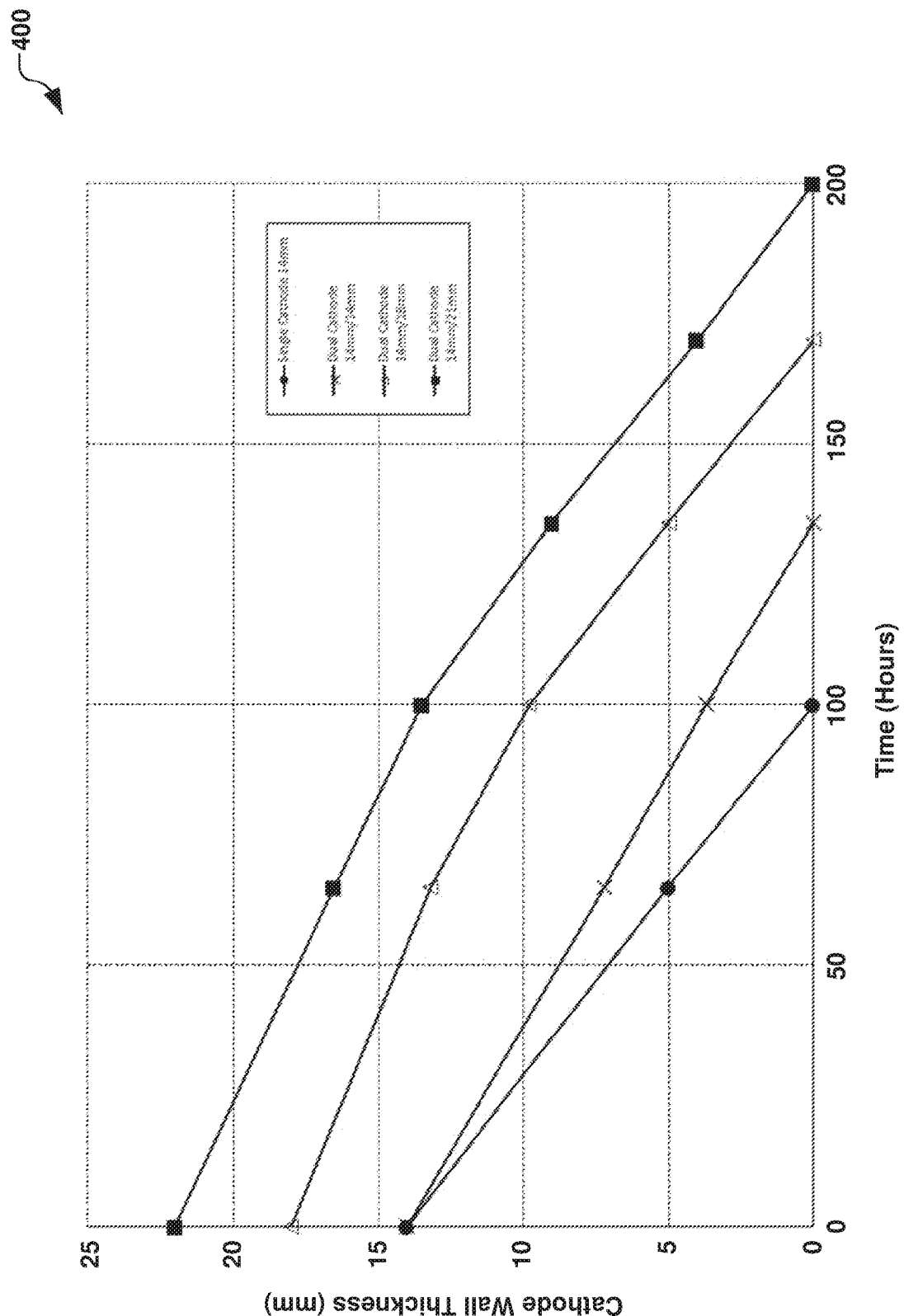
FIG. 6 is a graph illustrating various ion source lifetimes achieved using various thicknesses of cathodes in accordance with several aspects of the present disclosure.

As illustrated in FIG. 6, the method begins in act 302, whereby a source material (e.g., As, B, P, etc.) is provided to an arc chamber. In act 304, a filament power supply is electrically coupled to a first filament of a first indirectly heated cathode disposed within the arc chamber, and in act 306, the first filament is energized via the filament power supply, thereby heating the first indirectly heated cathode to aid in forming a plasma from the source material within the arc chamber.

In act 308, the filament power supply is electrically decoupled from the first filament, and the filament power supply is electrically coupled to a second filament of a second indirectly heated cathode disposed within the arc chamber. The second filament is energized in act 310 via the filament power supply, thereby heating the second indirectly heated cathode to aid in forming the plasma within the arc chamber. In act 312, the filament power supply is decoupled from the second filament, and acts 304 through 312 are repeated until one or more predetermined criteria are met in act 314, as described above.

In accordance with yet another aspect of the disclosure, FIG. 6 illustrates a graph 400 for various configurations of first and second cathodes 212, 226 in any of FIGS. 2-4. The present disclosure, for example, appreciates that a cathode, when used as a repeller or anticathode (e.g., held at the same potential as the cathode but not heated to emit electrons through thermionic emission), is sputtered at a rate approximately 50% lower the rate observed when the same part is heated to become a cathode.

The present disclosure, however, further appreciates that switching cycles and times can be further varied when running mixed species, based on sputter rates. Further, the repeller (e.g., the inactive cathode) can further grow in thickness when running boron. Accordingly, variations in body wall thicknesses and species variations can further increase a lifetime of the ion source when considered in conjunction with the aforementioned switching schemes.

The ion source of the present disclosure, for example, can be configured to produce ions of boron, phosphorus and arsenic, as well as other species. Of these specific example species, however, arsenic is the heaviest, having the highest sputter rate coefficient. At higher charge states (e.g., As 4+), high arc voltages are also implemented, which can further affect the lifetime of ion source. For example, when implanting boron ions using $BF_3$, a halogen cycle or other effect will allow fluorine (F) to react with tungsten (W) of the first cathode, such that the tungsten is attracted to various surfaces within the ion source that may be colder, wherein the tungsten dissociates and tungsten is subsequently deposited or "grown" on such surfaces. In the present example, when applying power to the first cathode, tungsten can be deposited on the second cathode in a porous manner.

However, when switching arc power from the first cathode to the second cathode, problems may be experienced when starting the second cathode, whereby the emission may be low due to the surface properties of the second cathode changing from the deposition of the porous tungsten (e.g., the tungsten may be further mixed with another element such as phosphorus, boron, or arsenic). As such, a significant time may be needed to clean or sputter away such a deposition of tungsten.

The present disclosure advantageously avoids such significant times to clean or sputter the second cathode by switching the filament power supplied to the first filament and second filament a plurality of times, such that the power to the first and second cathodes alternates a plurality of times.

It will be appreciated that the present disclosure can incorporate a stepped cathode as discussed in co-pending U.S. application Ser. No. 17/330,801 to Axcelis Technologies, Inc. of Beverly, Mass., the contents of which are incorporated by reference herein, in its entirety. For example, one or more of the first and second cathodes of the present disclosure described above can comprise such a stepped cathode.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion source for an ion implantation system, the ion source comprising:
    an arc chamber having a first end and a second end;
    a first cathode associated with the first end of the arc chamber, the first cathode comprising a first cathode body and a first filament disposed within the first cathode body;
    a second cathode associated with the second end of the arc chamber, the second cathode comprising a second cathode body and a second filament disposed within the second cathode body;
    a filament power supply;
    a filament switch configured to selectively electrically couple the filament power supply to each of the first filament and the second filament, respectively, based on a position of the filament switch; and
    a controller configured to control the position of the filament switch to alternate the selective electrical coupling of the filament power supply between the first filament and second filament for a plurality of switching cycles based on one or more predetermined criteria.

2. The ion source of claim 1, wherein the one or more predetermined criteria comprise a first predetermined duration and a second predetermined duration associated with each respective switching cycle, wherein the filament power supply is electrically coupled to the first filament for the first predetermined duration in the respective switching cycle, and wherein the filament power supply is electrically coupled to the second filament for the second predetermined duration in the respective switching cycle.

3. The ion source of claim 2, wherein the one or more predetermined criteria further comprises a first total time at which the filament power supply is electrically coupled to the first filament over the plurality of switching cycles and a second total time at which the filament power supply is electrically coupled to the second filament over the plurality of switching cycles.

4. The ion source of claim 3, wherein the first total time and the second total time are approximately equal.

5. The ion source of claim 2, wherein the first predetermined duration and the second predetermined duration differ from one another for at least one of the plurality of switching cycles.

6. The ion source of claim 1, wherein the one or more predetermined criteria comprise a predetermined thickness of one or more respective walls of the first cathode body and the second cathode body.

7. The ion source of claim 1, wherein the first cathode body and the second cathode body are identical.

8. The ion source of claim 1, wherein the first cathode body comprises a first end wall facing the second end of the arc chamber, wherein the second cathode body comprises a second end wall facing the first end of the arc chamber, wherein the first end wall has a first wall thickness, wherein the second end wall has a second wall thickness, and wherein the second wall thickness is greater than the first wall thickness.

9. The ion source of claim 1, wherein the filament switch comprises a relay, wherein the controller is configured to alternate the electrical coupling of the filament power supply between the first filament and the second filament via a control of the relay.

10. The ion source of claim 1, further comprising:
   a cathode power supply; and
   a cathode switch configured to selectively electrically couple the cathode power supply to each of the first cathode and the second cathode, respectively, based on a position of the cathode switch, and wherein the controller is further configured to control the position of the cathode switch based, at least in part, on the position of the filament switch.

11. An ion source for an ion implantation system, the ion source comprising:
   an arc chamber having a first end and a second end that opposes the first end;
   a first cathode positioned proximate to the first end of the arc chamber, wherein the first cathode comprises:
      a first cathode body having a first end wall facing the second end of the arc chamber; and
      a first filament disposed within the first cathode body;
   a second cathode positioned proximate to the second end of the arc chamber, wherein the second cathode comprises:
      a second cathode body having a second end wall facing the first end of the arc chamber; and
      a second filament disposed within the second cathode body;
   a filament power supply;
   a filament switch configured to selectively electrically couple the filament power supply to each of the first filament and the second filament, respectively, based on a position of the filament switch; and
   a controller configured to control the position of the filament switch to alternate the electrical coupling of the filament power supply between the first filament and second filament for a plurality of switching cycles based on one or more predetermined criteria.

12. The ion source of claim 11, wherein the one or more predetermined criteria comprise a first total time at which the filament power supply is electrically coupled to the first filament over the plurality of switching cycles and a second total time at which the filament power supply is electrically coupled to the second filament over the plurality of switching cycles, wherein the first total time and second total time are approximately equal.

13. The ion source of claim 11, wherein the one or more predetermined criteria comprise a respective first predetermined duration of operation of the first filament for at least one of the plurality of switching cycles and a second predetermined duration of operation of the second filament for the at least one of the plurality of switching cycles, wherein the first predetermined duration of operation of the first filament and the second predetermined duration of operation of the second filament differ from one another.

14. The ion source of claim 11, wherein the one or more predetermined criteria comprise a predetermined thickness of one or more of the first end wall and the second end wall.

15. The ion source of claim 11, wherein the first end wall has a first wall thickness, wherein the second end wall has a second wall thickness, and wherein the second wall thickness is greater than the first wall thickness.

16. The ion source of claim 11, further comprising:
   a cathode power supply; and
   a cathode switch configured to selectively electrically couple the cathode power supply to each of the first cathode and the second cathode, respectively, based, at least in part, on the position of the filament switch.

17. A method for increasing a lifetime of an ion source, the method comprising the acts of:
   (a) providing a source material to an arc chamber;
   (b) electrically coupling a filament power supply to a first filament of a first indirectly heated cathode disposed within the arc chamber;
   (c) energizing the first filament via the filament power supply, thereby heating the first indirectly heated cathode to aid in forming a plasma from the source material within the arc chamber;
   (d) electrically decoupling the filament power supply from the first filament and electrically coupling the filament power supply to a second filament of a second indirectly heated cathode disposed within the arc chamber;
   (e) energizing the second filament via the filament power supply, thereby heating the second indirectly heated cathode to aid in forming the plasma within the arc chamber;
   (f) electrically decoupling the filament power supply from the second filament; and
   (g) repeating acts (b) through (f) until one or more predetermined criteria are met.

18. The method of claim 17, wherein act (c) is performed for a first predetermined duration, and wherein act (e) is performed for a second predetermined duration, wherein the first predetermined duration and second predetermined duration are selectively variable based on the repetition performed in act (g).

19. The method of claim 18, wherein the one or more predetermined criteria comprise one or more of a first total time at which the filament power supply is electrically coupled to the first filament and a second total time at which the filament power supply is electrically coupled to the second filament.

20. The method of claim 19, wherein the first total time and the second total time are approximately equal.